(12) United States Patent
Murrell

(10) Patent No.: US 7,351,986 B2
(45) Date of Patent: Apr. 1, 2008

(54) METHOD AND APPARATUS FOR REDUCING CROSS CONTAMINATION OF SPECIES DURING ION IMPLANTATION

(75) Inventor: Adrian Murrell, Horsham (GB)

(73) Assignee: Applied Materials, Inc., Santa Clara, CA (US)

( * ) Notice: Subject to any disclaimer, the term of this patent is extended or adjusted under 35 U.S.C. 154(b) by 481 days.

(21) Appl. No.: 10/519,623

(22) PCT Filed: Jul. 1, 2003

(86) PCT No.: PCT/GB03/02812

§ 371 (c)(1),
(2), (4) Date: Dec. 30, 2004

(87) PCT Pub. No.: WO2004/006280

PCT Pub. Date: Jan. 15, 2004

(65) Prior Publication Data

US 2005/0232726 A1 Oct. 20, 2005

(30) Foreign Application Priority Data

Jul. 3, 2002 (GB) .................................. 0215417.7

(51) Int. Cl.
*G21K 5/10* (2006.01)
*H01J 37/08* (2006.01)

(52) U.S. Cl. .............. 250/492.21; 250/398; 250/492.2; 118/45; 118/730; 204/192.1; 204/192.35; 216/62

(58) Field of Classification Search ............... 118/45, 118/730; 204/192.1, 192.35; 216/62; 250/398, 250/492.2

See application file for complete search history.

(56) References Cited

U.S. PATENT DOCUMENTS

| 4,937,206 A | 6/1990 | Jaffe et al. |
| 5,476,520 A | 12/1995 | Jaffe et al. |
| 6,093,456 A * | 7/2000 | England et al. ............. 427/523 |
| 6,392,245 B1 * | 5/2002 | Edwards et al. ....... 250/492.21 |
| 6,566,661 B1 | 5/2003 | Mitchell |
| 6,608,316 B1 | 8/2003 | Harrison |

FOREIGN PATENT DOCUMENTS

| EP | 0407985 | 1/1991 |
| WO | 0113410 | 2/2001 |

OTHER PUBLICATIONS

Murrell, A., Wauk, M. Clarke, N. Burgin, D. Scotney-Castle, M Lee, R.M. Carpentier, K. Harringon, K. " Dopant Cross-Contamination Reduction with a 3-Position Beamstop",1997, Proceedings of the 11th International Conference on Ion Implantation Technology, pp. 147-150.*

* cited by examiner

*Primary Examiner*—Jack Berman
*Assistant Examiner*—Meenakshi S Sahu
(74) *Attorney, Agent, or Firm*—Boult Wade Tennant

(57) ABSTRACT

A wafer support for an ion implanter includes a wafer holder and a support arm for the holder in the implant chamber. A portion of the support arm adjacent the wafer holder is at least intermittently exposed to the ion beam during implantation, as a result of the relative scanning of the ion beam and the wafer holder. An arm shield mechanism has a plurality of shielding surfaces which can be selectively disposed to receive the ion beam to protect the exposed portion of the support arm. The shielding surfaces may form a sleeve arranged over the arm which may be rotatable above the arm to present selected surfaces to the ion beam. Cross contamination when successively implanting different species can be reduced by presenting different shield surfaces to the beam.

13 Claims, 5 Drawing Sheets

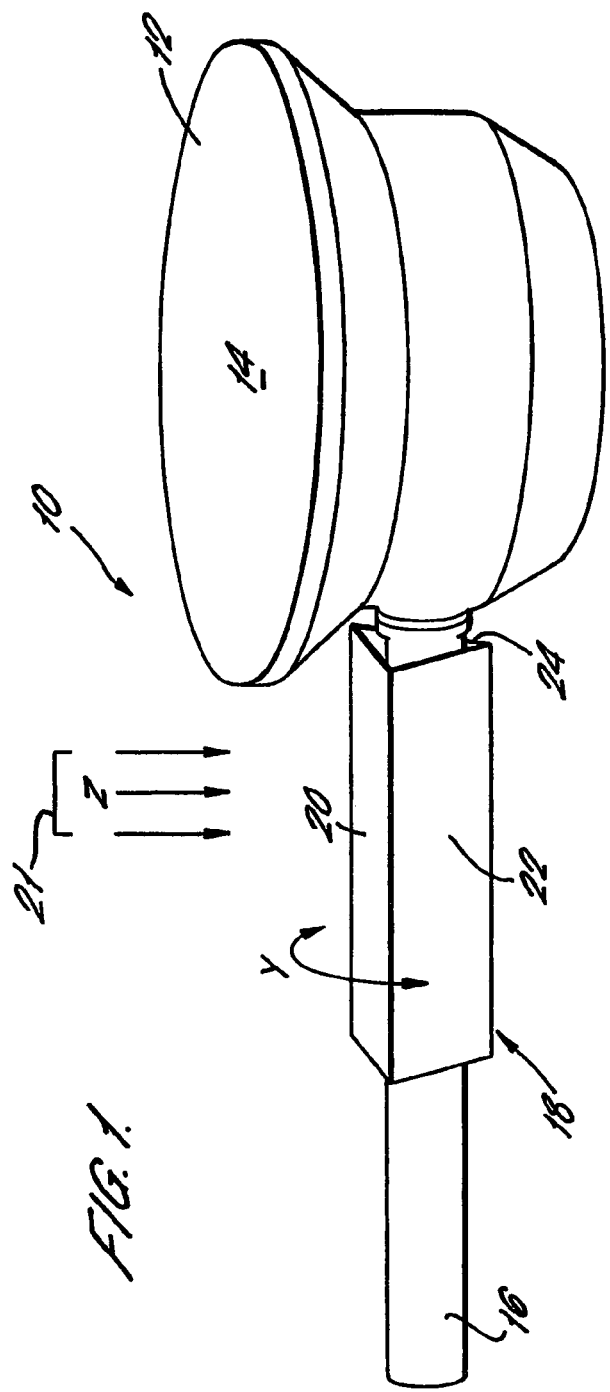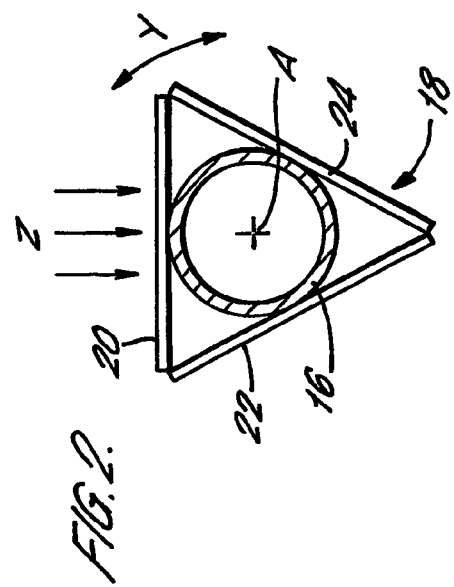

METHOD AND APPARATUS FOR REDUCING CROSS CONTAMINATION OF SPECIES DURING ION IMPLANTATION

1. FIELD OF THE INVENTION

This invention relates to ion implantation methods and apparatus.

2. DESCRIPTION OF RELATED ART

Ion implanters are well known in the semiconductor wafer processing field and are used to implant various atomic species into wafers to change their electrical characteristics. Typically, boron, phosphorous or arsenic can be implanted to form p-type or n-type regions within the semiconductor.

The wafer can be held by a chuck in the ion implanter end station or deposition chamber. During processing, the ions produced are accelerated to form an ion beam which is filtered and scanned across the wafer's surface. In one application, the ion beam is scanned in a direction and the wafer (mounted on the chuck) is scanned in another direction, orthogonal to the ion beam scan direction, so that a substantially even distribution of ions are implanted in the wafer. Various other scanning arrangements are well known and do not need to be described in this document.

To facilitate the scanning movement of the wafer, the chuck can be mounted on a scanning mechanism arm. Also, wheel arrangements (for example, see FIG. 2 of U.S. Pat. No. 4,937,206) can be used for mounting and scanning many wafers in the end station.

To help ensure an even distribution of ions over the wafer's surface, particularly at the edge of each wafer, the ion beam is scanned over an area larger than the area of the wafer's surface being processed. Thus, an uneven ion distribution at the edges of the wafers is avoided; the ion beam is scanned across the wafer so that at the start and finish of each scan, the ion beam completely misses the wafer. As a result, the ion beam also at least intermittently impinges on the chuck arm (or support wheel) causing ion implantation into the arm. After several wafers have been processed a large amount of ions builds up on or in the arm's surface. These ions can be 'knocked off' the surface by other ions impacting on the arm and can cause uneven ion distribution on the wafer surface, or cross contamination of ions in the wafer.

Cross contamination occurs when ions of a different type, or species, are implanted using the same ion implanter apparatus. For example, if a batch of wafers are first implanted with arsenic, some of the arsenic becomes embedded on the chuck's arm. If another batch of wafers is later implanted with phosphorus using the same apparatus, then some of the arsenic implanted in the arm is knocked off the arm by the phosphorus ions and contaminates the phosphorous implanted wafers with arsenic.

The prior art has attempted to address this problem in several ways. One such method is to have a dedicated ion implanter for each species, however this can be expensive and is not desirable. Another solution is to minimise the arm's surface area, but this only provides a partial solution and it can easily be seen that cross contamination still occurs.

U.S. Pat. No. 4,937,206 (Applied Materials, Inc.) proposes a shield which covers exposed areas of a wafer support. The shield absorbs ions which would otherwise hit the support. The shield is held in position with an adhesive and is manually replaced after it has become contaminated. The manual replacement requires each shield patch to be peeled from the arm, the arm is then be cleaned before a new uncontaminated shield patch is adhered to the arm. As a result, the ion implanter cannot operate for the long periods required to change the shield.

SUMMARY OF THE INVENTION

Embodiments of the present invention aim to ameliorate the problems associated with the prior art.

In their broadest form, the embodiments provide a shield which can be changed without having to remove the contaminated shield from the implanter, so that a different part of the shield is exposed to ions.

More precisely, there is provided wafer support apparatus for an ion implanter having an implantation chamber for receiving an ion beam, comprising a wafer holder for holding a wafer in the implantation chamber during implantation, an arm for supporting the wafer holder in the implantation chamber and having a portion adjacent the wafer holder which is at least intermittently exposed to the ion beam during implantation, and an arm shield mechanism providing a plurality of shielding surfaces which can be selectively disposed to receive the ion beam to protect said exposed portion of the arm.

Embodiments have the advantage that the shield can be provided with many areas, possibly one for each species of ion likely to be implanted, so that the appropriate shield area can be automatically positioned to cover the otherwise exposed arm, depending on the ion species, or the amount of ions likely to have been embedded in an already exposed part of the shield. Thus, the time taken to change shields is greatly reduced. If one shield portion for each ion species to be implanted is provided, the implanter can advantageously operate for very long periods compared to prior art systems before shield replacement is required, and with much reduced likelihood of cross contaminating wafers.

Furthermore, a simple automated shield transfer process in a preferred embodiment has the advantage of further reducing the ion implanter down time, particularly when a different batch of wafers require implantation of different ions to a previous wafer batch.

There is further provided a method for protecting an arm of a wafer support apparatus for an ion implanter having an implantation chamber for receiving an ion beam, the arm supporting a wafer holder in the implantation chamber and having a portion adjacent the wafer holder which is at least intermittently exposed to the ion beam during implantation, the method comprising; disposing a first shielding surface of a shield mechanism to receive the said ion beam to protect the said exposed portion of the arm for a pre-determined number of processes, and disposing a second shielding surface to protect the said exposed portion of the arm after a pre-determined number of wafer processes or if the ion species in the ion beam is changed.

Embodiments of the method have the advantage of reduced time periods for changing ion shields. This, in turn, provides the advantage of increasing the number of wafer processes within a given time period, in comparison with the prior art.

DESCRIPTION OF THE DRAWINGS AND EMBODIMENTS

Embodiments of the present invention are now described by way of example, and with reference to the accompanying drawings, in which:

FIG. 1 is a perspective view of an apparatus embodying the present invention;

FIG. 2 is a cross sectional view of the apparatus shown in FIG. 1;

Figure 3:
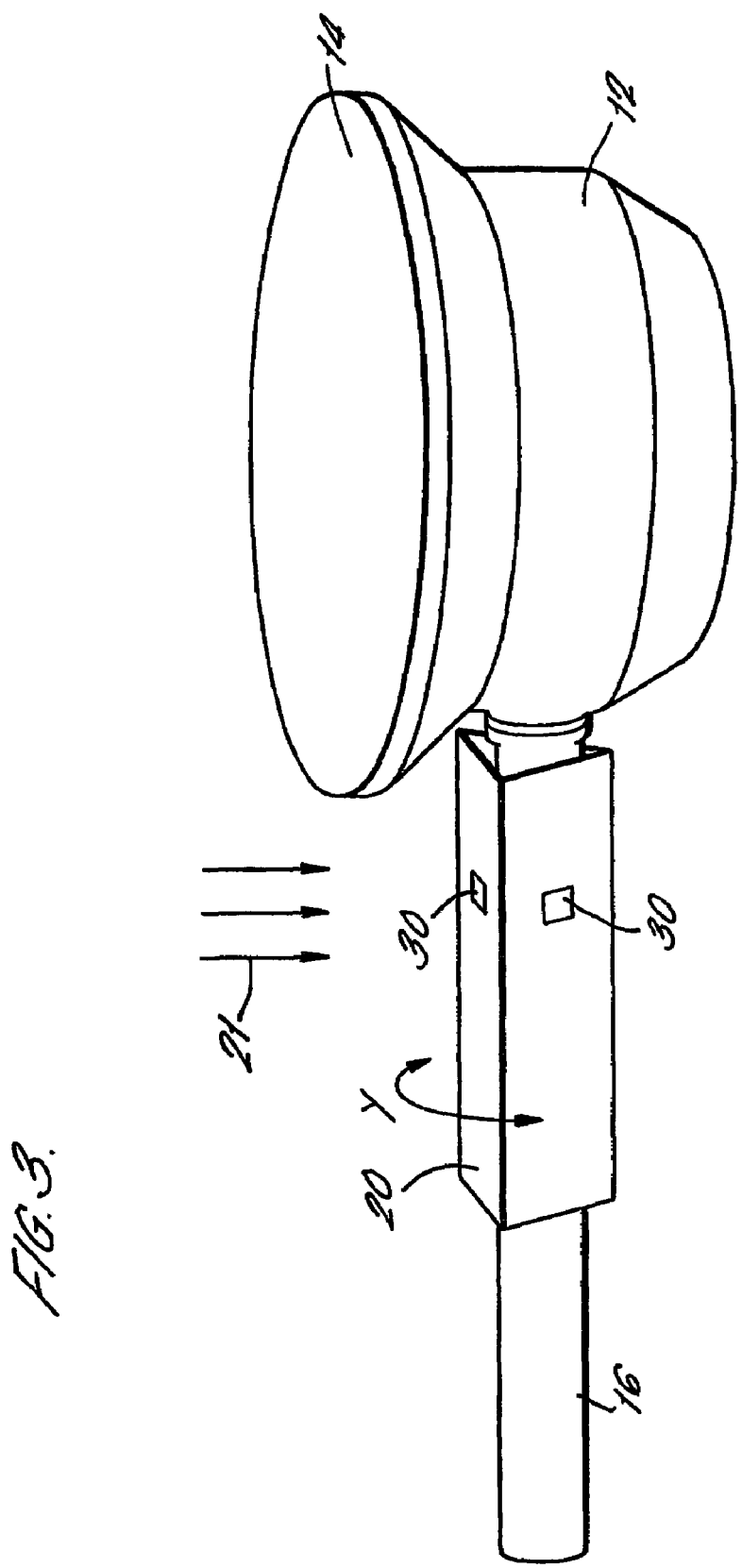
FIG. 3 is a perspective of another apparatus embodying the present invention.

Referring to FIG. 1, a wafer support mechanism 10 embodying the present invention is shown. The wafer support comprises a chuck 12 for holding the wafer during processing. The wafer (not shown in FIG. 1) is mounted on the upper surface 14 of the chuck 12. The chuck is supported by support arm 16 mounted at one end to the chuck and a chuck support means (not shown) at the other end. The wafer support mechanism is mounted in an ion implanter end chamber, or implantation chamber. Such chambers are known in the art and reference should be made to U.S. Pat. No. 6,207,959 (Applied Materials, Inc) for a detailed description.

An ion beam containing ions of the species being implanted in the wafer is accelerated by known apparatus (not shown). The ion beam follows a path approximal to that indicated by arrow Z in FIG. 1. The geometry of the ion beam is typically much smaller than the wafer geometry and the beam is scanned across the wafer surface using known techniques. Ion beams shaped into a ribbon are also possible, in which case, the ion beam can be scanned in one direction only, relative to the wafer so long as the width of the ribbon is greater than the wafer's diameter. At the instance shown in FIG. 1, the ion beam has been completed a scan across the face 14 of the chuck and the beam 21 impinges on an exposed portion of the support arm adjacent to the chuck. The apparatus required for scanning the beam are known and do not require explanation here.

A shield mechanism 18 is disposed over the support arm at the end of the arm closest to the chuck to cover the exposed portion of the support arm. The shield receives the ion beam to protect the end portion of the arm which would otherwise be exposed to the ion beam.

The shield mechanism 18 has three shielding surfaces, two of which 20 and 22 are shown in FIG. 1; the third shielding surface 24 is out of view. The shield mechanism is rotatable about the longitudinal axis of the arm, as indicated by arrow Y. Thus, a shielding surface can be moved into, or out of, the line of sight of the ion beam, as and when necessary. A locking mechanism (not shown) is provided to ensure the shield does not unduly rotate during wafer processing. The locking mechanism can be unlocked to allow shield to rotate between wafer processes. Each shielding surface can be locked into an appropriate position so that different surfaces can be presented for different ion implantation runs.

The shielding surfaces should be of a dimension to at least accommodate the ion beam width and the support arm width. More preferably, the shielding surface should accommodate the ion beam dimension. Since the ion beam's dimensions are a function of ion energy, it is preferable for the shielding surface to at least accommodate the ion beam which has the largest possible geometry for a given ion implanter. Additionally, the shielding surface may have a greater surface area than a minimal requirement to account for small errors in beam scan direction.

Preferably, the shield surfaces are moved into position between implantation processes and when the specie of ion in the ion beam changes. Thus, each shielding surface receives only one specie of ion, thereby helping to prevent ion cross-contamination of the wafer by other atomic species implanted in the shielding surfaces. For example, shield surface 20 can be designated to receive arsenic, shield surface 22 can be designated to receive phosphorus and shield surface 24 can be designated to receive boron. Hence, when an arsenic implantation is taking place shield surface 20 is arranged to protect the support arm. Then, if a wafer requiring boron implantation is to be processed, the shield mechanism 18 is rotated so that shielding surface 24 is now positioned to receive the ion beam and protect the arm from boron implantation. Any boron already in shielding surface 24 may become dislodged from the shielding surface by ions impinging on the shielding surface. However, because the same ion species is dislodged, no cross-contamination occurs.

Referring now to FIG. 2, a cross-section of the shielding mechanism and support arm in FIG. 1 is shown. Like reference numerals have been used in FIGS. 1 and 2 for the common features in this and subsequent drawings. Preferably, shielding surfaces 20, 22 and 24 have substantially the same dimensions. Thus, the cross-section of the shield mechanism prescribes an equilateral triangle, as shown in FIG. 2. Preferably, the shield surface exposed to receive the ion beam (surface 20 in FIG. 2) is arranged so that the angle of incident of the ion beam on the shield surface is perpendicular to the shielding surface. Also, the axis A about which the shielding mechanism rotates coincides with the longitudinal axis of the support arm.

Referring to FIG. 3, another embodiment of the present invention is shown. The embodiment shown in FIG. 3 provides an aperture 30 in each shielding surface of the shielding mechanism. Each aperture is arranged so that ions in the beam pass through the aperture to a Faraday disposed under the shielding surface and in line of sight with the ion beam. Faradays are well known devices which can be used to monitor the spatial profile of the ion beam. Preferably, the aperture geometry is less than the Faraday geometry. Thus, the likelihood of ions passing through the aperture and being implanted in the support arm (rather than being absorbed by the Faraday) is reduced. An aperture is required on each shielding surface so that the Faraday is operable for each ion specie being implanted. Also, the Faraday should be positioned as close to the aperture as possible to reduce the necessity to realign the shield mechanism if the wafer is tilted.

Figure 4:
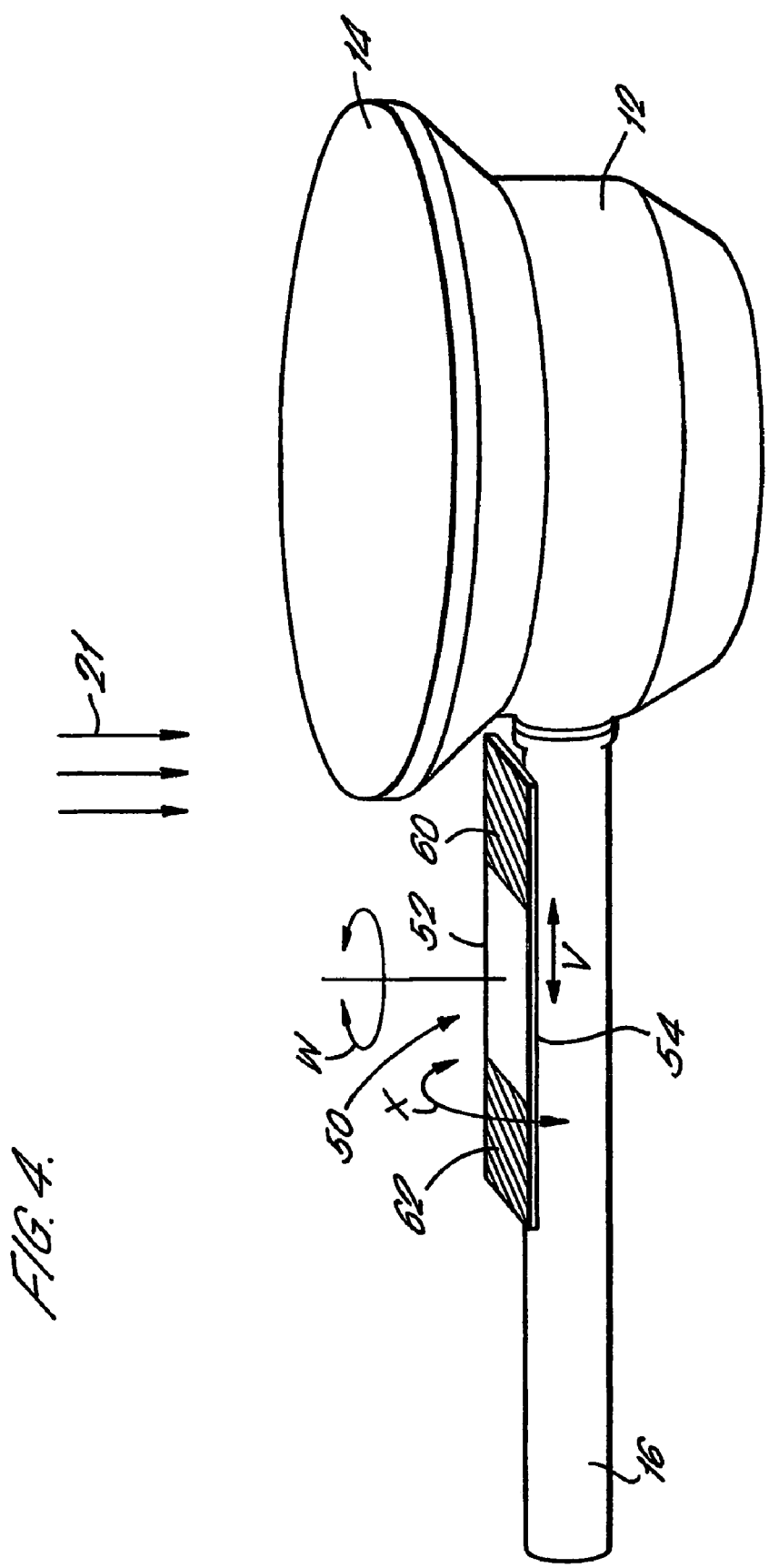
FIG. 4 is a perspective view of another apparatus embodying the present invention.

Referring to FIG. 4, another embodiment is shown in perspective view. A detachable arm shield 50 is arranged over the support arm which would otherwise be exposed to the ion beam during wafer processing. The detachable shield 50 has two shielding surfaces, 52 and 54, one on each side of the shield. The shield 50 can be flipped over or inverted, as indicated by arrow X, so that either shielding surface 52 or 54 is selectively disposed to receive the ion beam. As described previously, each shielding surface can be arranged to receive a different ion specie being implanted; the shield surface being changed before the ion specie is changed.

Alternatively, the detachable shield can be rotated about its centre as indicated by arrow W. In this way, the end portions of each shielding surface, as indicated by shaded areas 60 and 62 on shielding surface 52, can also be interchanged to receive different ion species. Similar end portions on shielding surface 54 can also be arranged. Thus, the shield mechanism can be arranged to receive up to four ion species, one specie in each end portion. Further surfaces can be included by adding 'spokes' to form a propeller shaped arrangement having one surface at the end of each spoke for receiving a different ion specie.

In this alternative embodiment, the detachable arm shield must have sufficient length so that end portions 60 and 62 are spaced apart by a sufficient amount to reduce the likelihood of ions being received by both end portions at the same time (which would result in atomic species cross-contamination in the wafer). Hence, the overall length of the detachable arm shield must be at least twice the width of the ion beam, and preferably at least four times the ion beam width.

A further alternative embodiment is provided where the shield 52 can slide along the longitudinal axis of the arm 16, as indicated by arrow V. In this embodiment, the shield should be slid by a distance greater than the maximum beam width so that a different area of the shield receives a different ion specie to help prevent cross-contamination. Also, a cavity (not shown) into can be arranged in the chuck to accommodate the shield when it is disposed in at least one of its positions to receive ions in the beam.

Figure 5:
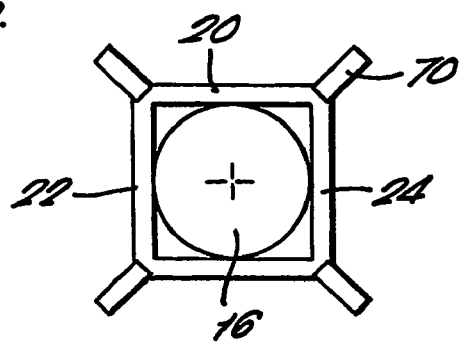
FIG. 5 is cross sectional view of another apparatus embodying the present invention.

Referring to FIG. 5, a cross-section (through the longitudinal axis of the support arm) of a shield mechanism and support arm is shown. The embodiment in FIG. 5 has four shielding surfaces arranged so that the shield mechanism cross-section prescribes a square. Protrusions, or ribs, 70 extend from an edge of each shielding surface, where it adjoins a juxtaposed shielding surface. The ribs preferably extend along the shield mechanism longitudinal edge and at a 45° angle with respect to the shielding surface plane. The ribs are made from the same material as the shielding surface. Thus, it is appreciated that each shielding surface is defined by a concave channel running parallel to the longitudinal axis of the support arm. The ribs defining the walls of the channel are preferable to help prevent adjacent shielding surfaces being exposed to the ion beam. Such exposure could result in cross-contamination of the wafer being processed when the shield mechanism is rotated to bring an alternative shielding surface into line of sight of the ion beam when the ion species in the ion beam is changed. Preferably, the ribs should extend by at least one-fifth the width of the shield's width. Hence, the ribs 70 shadows other shielding surfaces from the ion beam. Also, the shield surface plane should remain perpendicular to the ion beam for this embodiment. Hence, the shield sleeve of the embodiment shown in FIG. 5 must rotate independently to the chuck arm when (or if) ions are implanted at high tilt angles.

Figure 6:
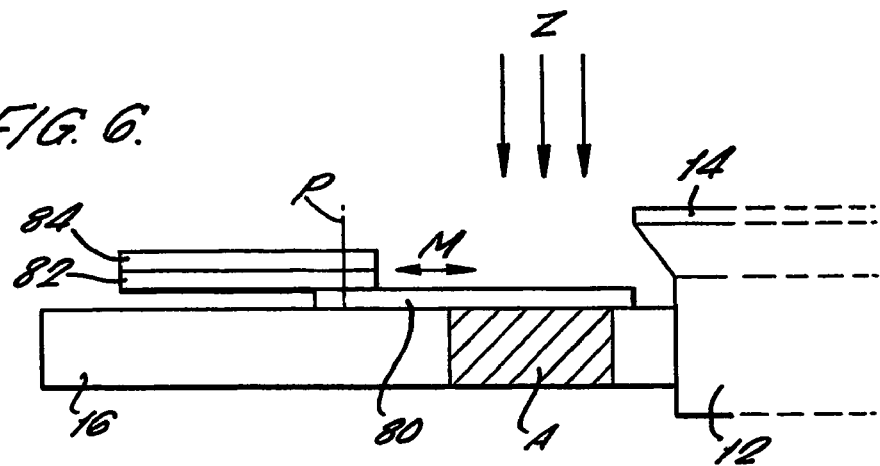
FIG. 6 is cross sectional view of another apparatus embodying the present invention.

Referring to FIG. 6, a cross-section of an alternative shield mechanism embodiment is shown. The cross-section is taken along the longitudinal axis of the support arm. The portion of the arm adjacent the wafer chuck whose surface is exposed to the ion beam during implantation is indicated by shaded area A.

In this alternative embodiment a first shielding surface 80 is disposed over the portion of the arm adjacent the chuck 12. Second and third shielding surfaces, 82 and 84 respectively, are arranged to be moved into position above the first shielding surface 80, for example, when the ion species in the ion beam is changed. Each surface is arranged to receive one ion species, as described previously, to help prevent cross-contamination of atomic species implanted in the wafer being processed. Each of the second and third shield surfaces can be moved into position using a sliding movement, as indicated by arrow M. Alternatively, the shield surface can be rotated into position about an axis P.

Preferably the first shielding surface 80 is kept in position over the exposed portion A and the second and third shielding surfaces are moved into position over the first shielding surface when the ion species is changed. However, the second and third (and any subsequent) shielding surface should have sufficient thickness to absorb all the ion species in the beam Z to prevent ions penetrating to any shielding surface thereunder, and consequently resulting in the much increased probability of cross-contamination when the upper shielding surface is removed from the ion beam path.

Figure 7:
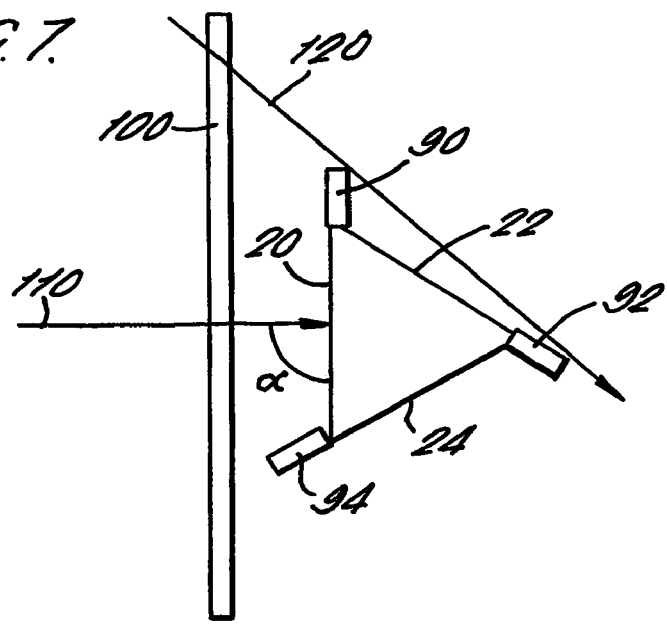
FIG. 7 is cross sectional view of another apparatus embodying the present invention.

Referring to FIG. 7, an alternative embodiment is shown to the embodiment shown in FIG. 2. A rib extends from an edge of each shielding surface; rib 90 extends from shielding surface 20 in the plane of the shielding surface 20, rib 92 extends from shielding surface 22, and so on. Preferably, the ribs extend from the right-hand side edge of each shielding surface. The ribs extend along the longitudinal length of each shielding surface, as described for the embodiment shown in FIG. 5.

Thus, during high angle implantation, a shield adjacent to the shielding surface exposed to the ion beam is protected or shadowed from ions in an ion beam. This embodiment is particularly useful if the shield mechanism is not rotated during high angle implantation, but is kept generally parallel with the wafer 100. Thus, shielding surface 22 can be shielded from the ion beam 110 at normal angle of incidence, and from the ion beam 120 at high angular implantation angles, without having to rotate the shield mechanism.

The width of each extension needs to be sufficient to prevent glancing impact by ions in the beam on the shield surface being shadowed by the extension. It follows that, for the embodiment shown in FIG. 7 (equilateral triangular cross section shield arrangement), where α is the angle of incidence of the beam on the shield 20, then $$W_e \geq L\left[\frac{\tan\alpha - \tan 30°}{2\tan 30°}\right]$$

where $W_e$ is the width of the extension and L is width of the shield. Thus for a beam angle of incidence α=45°, $W_e$ should be at least 37% the width L of the shield surface. Where α=60°, $W_e$ should be at least equal to L.

With reference to FIG. 5, any ion beam divergence should be accounted for when calculating $W_e$. For a beam divergence of 10°, $W_e$>25% of the dimension of the face 22 width (since $\sqrt{2}$ tan 10°=0.25).

Figure 8:
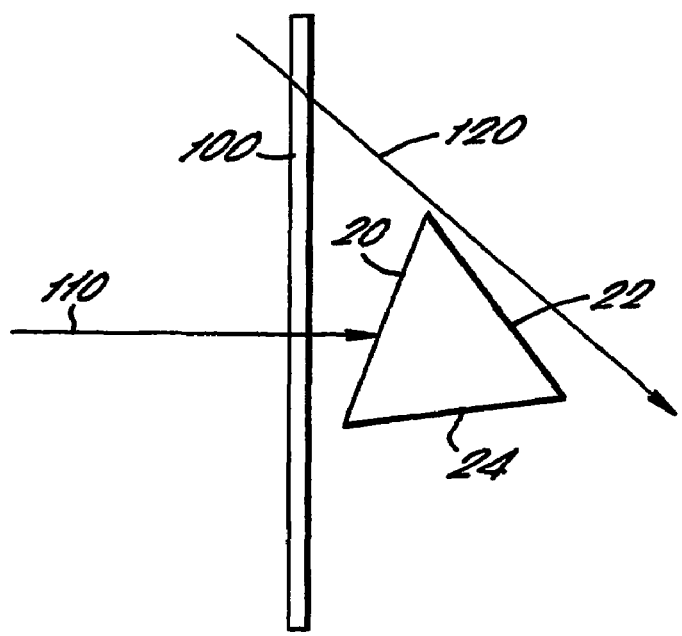
FIG. 8 is cross sectional view of another apparatus embodying the present invention.

Alternatively, the shielding surface can be tilted towards the direction of the ion beam, as shown in FIG. 8. The shield mechanism can be arranged to be tilted at discrete angles, or increments, with respect to the chuck upper surface, or wafer. So, when high angle implantation is required (that is, implantation of ions with angles of incidence greater than 15°, for example), the shield mechanism can be titled to a desired angle and so that ions are only implanted on one shielding surface. The angular increments are preferably 22.5°, although other higher or lower increments can be used.

Alternatively, six pre-selected orientations can be used with equal angular increments at, for example, 0°, 30°, 60°, 90° and so on through to 270°. Most preferably, however, the shielding surface is aligned with the ion beam so that ions strike the surface orthogonally, thus minimising the back-sputtering yield. The locking mechanism described above can be arranged so that the shielding surfaces are locked in these discrete angular increments.

The shielding mechanisms described above can be rotated manually or by mechanical means comprising an appropriate drive motor and any necessary gear linkage. The motor could be automated to change the shield orientation when the ion implantation recipe is changed (thus changing the shielding surface exposed to the beam), or when the angle of implantation changes.

Furthermore, the shielding surfaces may also require cooling, since the shielding surfaces may get hot during ion implantation. Cooling of all the shielding surfaces is preferable to avoid any species evaporating from any shielding surface during ion implantation. Such evaporation of a different ion specie from a shielding surface would be likely to cause cross contamination of the wafer being processed.

Figure 9:
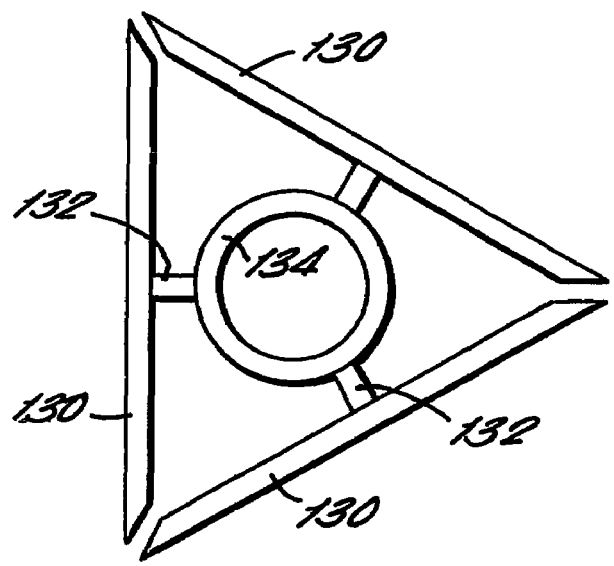
FIG. 9 is a cross sectional view of another embodiment of the present invention.

Preferably, the shielding surfaces are cooled using a water cooling system in parallel with any chuck/wafer cooling system. Alternatively, shield plates fabricated from graphite require little or no cooling. Furthermore, FIG. 9 shows an alternative embodiment of the present invention where the shields 130 are mounted on columns 132 or ribs to space the shield from the sleeve 134. Thus, there is no, or minimal contact between the plates and hence little (or no) transfer of heat from one plate to another; each shielding surface is thus thermally isolated from a juxtaposed shielding surface.

The shielding surfaces are preferably made of the same material as the wafer substrate. Alternative materials suitable for receiving the ions being implanted may also be used, such as graphite, silica, silicon, suitable photo-resist material or aluminium. Other metal alloys or organic materials, such as polycarbonates could also be used.

A locking mechanism should be provided for all the embodiments described to prevent or reduce movement or displacement of the shielding surface during implantation. During normal operation, once the shield is in position, it is locked in place until it is required to be moved.

Other shield mechanisms and arrangements of shielding surfaces will be envisaged by a skilled artisan which embody the present invention. For example, the shielding surfaces could be arranged on a disk-like mechanism, disposed on the supporting arm so that different shielding surfaces can be rotated into position to shield the exposed portion of the support arm. The disk could rotate in the same plane as the chuck upper surface. Alternatively, the shield apparatus could be mounted in front of the chuck arm, rather than over the arm.

Furthermore, the embodiments described above all relate to single wafer ion implanters. However, the present invention would be equally suited to batch wafer implantation equipment, such as is shown in FIG. 2 of U.S. Pat. No. 4,937,206.

The invention claimed is:

1. Wafer support apparatus for an ion implanter having an implantation chamber for receiving an ion beam, comprising
    a wafer holder for holding a wafer in the implantation chamber during implantation,
    an arm carrying the wafer holder in the implantation chamber and having an arm portion adjacent the wafer holder which is at least intermittently exposed to the ion beam during implantation, and
    an arm shield mechanism on the arm and having a plurality of shielding surfaces which can be selectively disposed to shield said arm portion from said at least intermittent exposure to the ion beam.

2. An apparatus according to claim 1, wherein the shielding surfaces are disposed on a sleeve arranged over the arm.

3. An apparatus according to claim 2, wherein the sleeve is rotatable about a longitudinal axis of the arm.

4. An apparatus according to claim 2, wherein the sleeve has three or more facets and a shielding surface is disposed on each facet.

5. An apparatus according to claim 2, wherein each shielding surface further comprises a ridge extending substantially from an end of the shielding surface closest to the wafer support and along the longitudinal axis of the arm when the shielding surface is disposed to receive the ion beam.

6. An apparatus according to claim 5, wherein the ridge or ridges of a first shielding surface protrude by a sufficient amount to receive the ion beam and to protect at least one juxtaposed shielding surface.

7. An apparatus according to claim 4, wherein the shielding surface disposed to receive the ion beam is arranged so that the ion beam strikes the said shielding surface with a substantially perpendicular angle of incidence.

8. An apparatus according to claim 1, wherein each shielding surface is thermally isolated from a juxtaposed shielding surface.

9. An ion implanter for implanting ions into a wafer, comprising an apparatus according to claim 1.

10. A method for protecting an arm of a wafer support apparatus for an ion implanter, the implanter having an implantation chamber for receiving an ion beam, the arm carrying a wafer holder in the implantation chamber and having aan arm portion adjacent the wafer holder which is at least intermittently exposed to the ion beam during wafer implantation,
    the method comprising;
    disposing a first shielding surface of a shield mechanism on the arm to shield said exposed arm portion from said at least intermittent exposure to the ion beam for a pre-determined number of processes, and
    disposing a second shielding surface to protect the said exposed arm portion after a pre-determined number of wafer processes or if the ion species in the ion beam is changed.

11. A method according to claim 10 wherein the shielding surfaces are moved automatically between wafer processes to protect the said exposed portion of the arm.

12. A method according to claim 10, wherein the shielding surfaces are disposed on a sleeve arranged over the arm, and the sleeve is rotated relative to a longitudinal axis of the arm to dispose a shielding surface to protect the said exposed portion of the arm.

13. A shield apparatus for mounting on an arm carrying a wafer holder in an implantation chamber of an ion implanter, said shield apparatus being arranged for protecting the arm from ions in an ion beam during a wafer ion implantation process, said apparatus comprising
    a plurality of shield portions, each being movable between a first and second position with respect to the arm, so that during an ion implantation process, ions in the ion beam are prevented from hitting the arm by a shield portion in the first position, and substantially no ions in the ion beam hit a shield portion in the second position.

* * * * *